US005484746A

United States Patent [19]
Ichikawa et al.

[11] Patent Number: 5,484,746
[45] Date of Patent: Jan. 16, 1996

[54] PROCESS FOR FORMING SEMICONDUCTOR THIN FILM

[75] Inventors: Takeshi Ichikawa, Sendai; Takao Yonehara, Atsugi, both of Japan

[73] Assignee: Canon Kabushiki Kaisha, Tokyo, Japan

[21] Appl. No.: 270,309

[22] Filed: Jul. 5, 1994

Related U.S. Application Data

[63] Continuation of Ser. No. 963,268, Oct. 19, 1992, abandoned, which is a continuation of Ser. No. 799,887, Dec. 2, 1991, abandoned, which is a continuation of Ser. No. 576,840, Sep. 4, 1990, abandoned.

[30] Foreign Application Priority Data

Sep. 7, 1989 [JP] Japan ................................. 1-233940

[51] Int. Cl.⁶ ............................................... H01L 21/203
[52] U.S. Cl. .............................. 437/83; 437/84; 437/101; 204/192.25; 204/192.3
[58] Field of Search ................................ 437/83, 84, 101, 437/967; 204/192.25, 192.3

[56] References Cited

U.S. PATENT DOCUMENTS

| | | | |
|---|---|---|---|
| 3,021,271 | 2/1962 | Wehner | 204/192.3 |
| 3,704,219 | 4/1971 | McDowell | 204/192.3 |
| 4,585,517 | 4/1986 | Stemple | 204/192.25 |
| 4,757,030 | 7/1988 | Galvin et al. | 437/132 |
| 4,772,564 | 9/1988 | Barnett et al. | 437/967 |
| 4,824,546 | 4/1989 | Ohmi | 204/192.3 |
| 4,977,096 | 12/1990 | Shimada et al. | 437/83 |

FOREIGN PATENT DOCUMENTS

| | | | |
|---|---|---|---|
| 0306153 | 8/1989 | European Pat. Off. | H01L 21/20 |
| 62-126626 | 6/1987 | Japan | 437/84 |

OTHER PUBLICATIONS

Moustakas, "Studies of Thin Film Growth of Sputtered Hydrogenated Amorphous Silicon", Solar Energy Materials 8 (1982) 187–204.
Allison et al., "Further Optimization of Amorphous Hydrogenated Silicon . . . ", Proc., 3rd European Community Photovoltaic Solar Energy Conference, Cannes France, Oct. 27–31, 1980.
Martin et al., "Property Composition Relationships in Sputter–Deposited α–Si:H Alloys", Solar Energy Materials 2(1979/1980) 143–157.
European Search Report dated Apr. 6, 1994.
Applied Physics Letters, vol. 48, No. 12, Mar. 24, 1986, pp. 773–775.
Japanese Journal of Applied Physics, vol. 26, No. 11, Nov. 1987, pp. 1815–1817.
Ohmi et al., "In–Situ Substrate Surface Cleaning for Very Low Temperature Silicon Epitaxy . . . ", Appl. Phys. Lett. vol. 53, No. 1, pp. 45–47 (Jul. 4, 1988).
Ohmi et al., "Low Temperature Silicon Epitaxy by Low–Energy Bias Sputtering", Appl. Phys. Lett. vol. 53, No. 5, pp. 364–366 (Aug. 1, 1988).

*Primary Examiner*—R. Bruce Breneman
*Assistant Examiner*—Ramamohan Rao Paladugu
*Attorney, Agent, or Firm*—Fitzpatrick, Cella, Harper & Scinto

[57] ABSTRACT

A process for forming a semiconductor thin film by forming an amorphous semiconductor film on a substrate having a surface comprising an amorphous insulating material and seed crystals arranged at desired positions, applying heat treatment on the amorphous semiconductor film and growing crystals by solid phase growth with the seed crystals as the origination points is characterized in that high frequency energies with different frequencies are supplied to a susceptor having the substrate mounted thereon and a target holder to irradiate the ions generated between the susceptor and the target holder to the substrate and remove the surface adherents on the substrate, and subsequently an amorphous semiconductor film is formed on the substrate within the same apparatus.

7 Claims, 3 Drawing Sheets

PROCESS FOR FORMING SEMICONDUCTOR THIN FILM

This application is a continuation, of application Ser. No. 07/963,268 filed Oct. 19, 1992, now abandoned, which is a continuation of application Ser. No. 07/799,887 filed Dec. 2, 1991, now abandoned, which is continuation of application Ser. No. 07/576,840 filed Sep. 4, 1990, which is now abandoned.

BACKGROUND OF THE INVENTION

1. Field of the invention

This invention relates to a process for forming a semiconductor thin film, particularly to a process for forming a single crystal region on an amorphous insulating substrate. The present invention can be suitably used for, for example, SOI technique.

2. Related Background Art

In the prior art, a single crystal thin film indispensable for formation of a semiconductor device has been formed generally by epitaxial growth from a single crystal substrate.

However, according to this method, no single crystal can be grown on an amorphous substrate, and it is extremely difficult to effect crystal growth of a crystalline material having different lattice constants or coefficient of thermal expansion from those of the single crystal substrate, whereby the substrate material and the kind of the grown film have been limited.

On the other hand, in research and developments in recent years, there have been developments of three-dimensional integrated circuits to effect higher integration and multiple functionalization by lamination of semiconductor devices on a substrate, or switching transistors of liquid crystal picture elements in which solar batteries or devices are arranged in arrays by depositing semiconductor materials on an inexpensive glass substrate. The technique of realizing a structure having a semiconductor thin film of high quality formed on an amorphous insulating substrate (SOI structure) common to these devices is becoming important.

In recent years, to obtain such SOI structure, various research has been done, and the lateral solid phase growth method (L-SPE) which can be practiced at a process temperature of 600° C. or lower is one of the techniques particular interest.

However, to cause solid phase growth to occur with the single crystal of the substrate as the seed crystal, because it is not electrically insulated from the substrate, and also because a polycrystalline region is formed due to random nucleus generation and growth occurring primarily at the $SiO_2$— amorphous silicon interface within amorphous silicon remote from the seed crystal on the substrate, the growth distance from the seed crystal is as short as several μm to 10 and several μm. Further there is a problem of defects remaining within the L-SPE layer (many twin crystals, and dislocations). In order to solve these problems and introduce the L-SPE technique into device application, the surface cleaning technique of the substrate before deposition of the amorphous semiconductor layer becomes very important. Recently, there have been practiced (1) heat treatment at 800° C. under ultra-high vacuum (H. Ishiwara, A. Tambe, and S. Furukawa, Appl. Phys. Lett. 48, 773 (1986)), (2) cleaning by Ar sputtering (heat treatment at 680° C.) (K. Kusukawa, M. Moniwa, E. Murakami, M. Miyao, T. Warabisako, and Y. Wade, Extended Abstracts of the 19th Conference on Solid State Devices and Materials, Tokyo, 1987, pp 179– 182), (3) etching with $Si_2H_6/H_2$ gas (heat treatment at 850° C.) (Y. Kunii, and Y. Sakakibara, Jpn. J. Appl. Phys. 26, 1816 (1987)), but in view of the lowered temperature process, cleaning by sputtering of (2) may be considered desirable. The sputter cleaning of the semiconductor with argon has been also used as the pre-treatment of low temperature silicon epitaxial growth by CVD. Although argon ions having an energy higher than the sputtering threshold value of the substrate material, i.e. generally more than 100 eV are used, since heat treatment is also used, the radiation damage and other damages caused at the time of sputtering are reduced (W. R. Burger, J. H. Comfort, L. M. Garverick, T. R. Yew, and R. Rief, IEEE ELECTRON DEVICE LETTERS, Vol. EDL-8 pp. 168 (1987)).

At present, even when the cleaning techniques of (1)–(3) are employed, the lateral growth distance is short, and there are many crystal defects in the semiconductor thin film formed, and there are many remaining tasks for device preparation.

SUMMARY OF THE INVENTION

An object of the present invention is to provide a process for forming a semiconductor thin film which forms a single crystalline region of high quality on an amorphous insulating substrate.

It is also another object of the present invention is to provide a process for forming a semiconductor thin film which can grow a single crystal thin film of high quality at a sufficiently large region necessary for device formation on an amorphous insulating substrate, and also can form device having characteristics equal to a semiconductor device formed on a bulk single substrate within the single crystal film.

Still another object of the present invention is to provide a process for forming a semiconductor thin film, which can be applied to high speed, high performance devices with little parasitic capacity with substrate, typically three-dimensional integrated circuit due to SOI structure. Examples of such devices are high performance solar battery on glass substrate, radiation resistant devices, etc.

DETAILED DESCRIPTION OF THE PREFERRED EMBODIMENTS

Figure 1A:
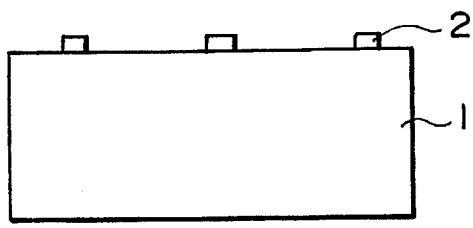
FIGS. 1A to 1D are schematic sectional views showing the embodiments of the process for forming the semiconductor thin film according to the present invention.
Figure 1B:
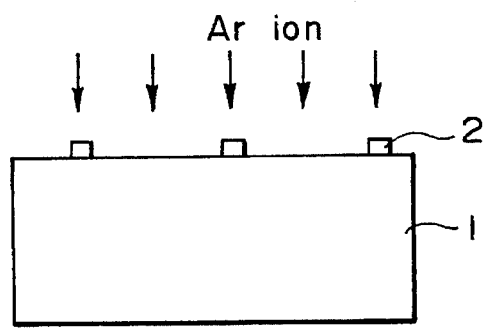

Referring now to the drawings, the embodiments of the present invention are described below in detail.

FIG. 1 is a schematic sectional view showing the preparation steps of the process for forming the semiconductor thin film according to the present invention.

Figure 1C:
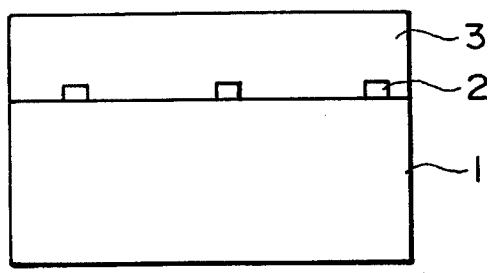

First, as shown in FIG. 1A, by use of conventional method for formation of seed crystals, a fine single crystal region 2 is formed on the surface of an amorphous insulating substrate 1. And, according to the method as described below, by use of ions controlled precisely to an energy of some eV, surface adherents on the single crystal region and the amorphous insulating substrate are removed to have a clean surface exposed (FIG. 1B), and an amorphous semiconductor layer 3 is deposited within the same device before any contaminant is adsorbed on said clean exposed surface (FIG. 1C).

Here, cleaning for removal of the above-mentioned surface adherents is performed by use of ions controlled in magnitude of energy. Specifically, the energy of ions is an energy lower than the sputtering threshold value of the above-mentioned single crystal region and the above-mentioned amorphous insulating substrate, and may be made preferably 40 eV or less, more preferably 10 eV or less.

It is desirable that the surface cleaning step and the later deposition step of the amorphous semiconductor layer should be performed continuously so that no contaminant may be adsorbed. An example of removing surface adherents with ions controlled precisely in energy to some eV has been realized within the rf-dc junction bias sputtering apparatus in the form of cleaning of silicon surface with argon ions (T. Ohmi, T. Ichikawa, T. Shibata, K. Matsudo, and H. Iwabuchi, Appl. Phys. Lett. 53, 45 (1988)), and by performing sputtering film formation in the same apparatus immediately after the cleaning step, thin films exhibiting various crystallinities from single crystal silicon to amorphous silicon which are depend on the irradiation energy to the substrate can be deposited on silicon substrate (T. Ohmi, K. Matsudo, T. Shibata, T. Ichikawa, and H. Iwabuchi, Appl. Phys. Lett. 53, 364 (1988)).

Here, in the above-mentioned rf-dc junction bias sputtering apparatus, when the material to be treated is an electrical insulator, the potential of the substrate which is the material to be treated could not be controlled.

Accordingly, the present invention provides a method for forming a semiconductor thin film which can perform cleaning with the potential of the material to be treated being controlled even if the material to be treated may be an electrical insulator.

Figure 1D:
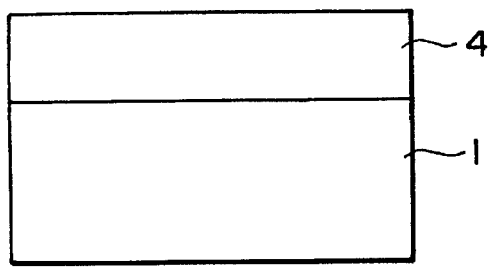
Figure 2:
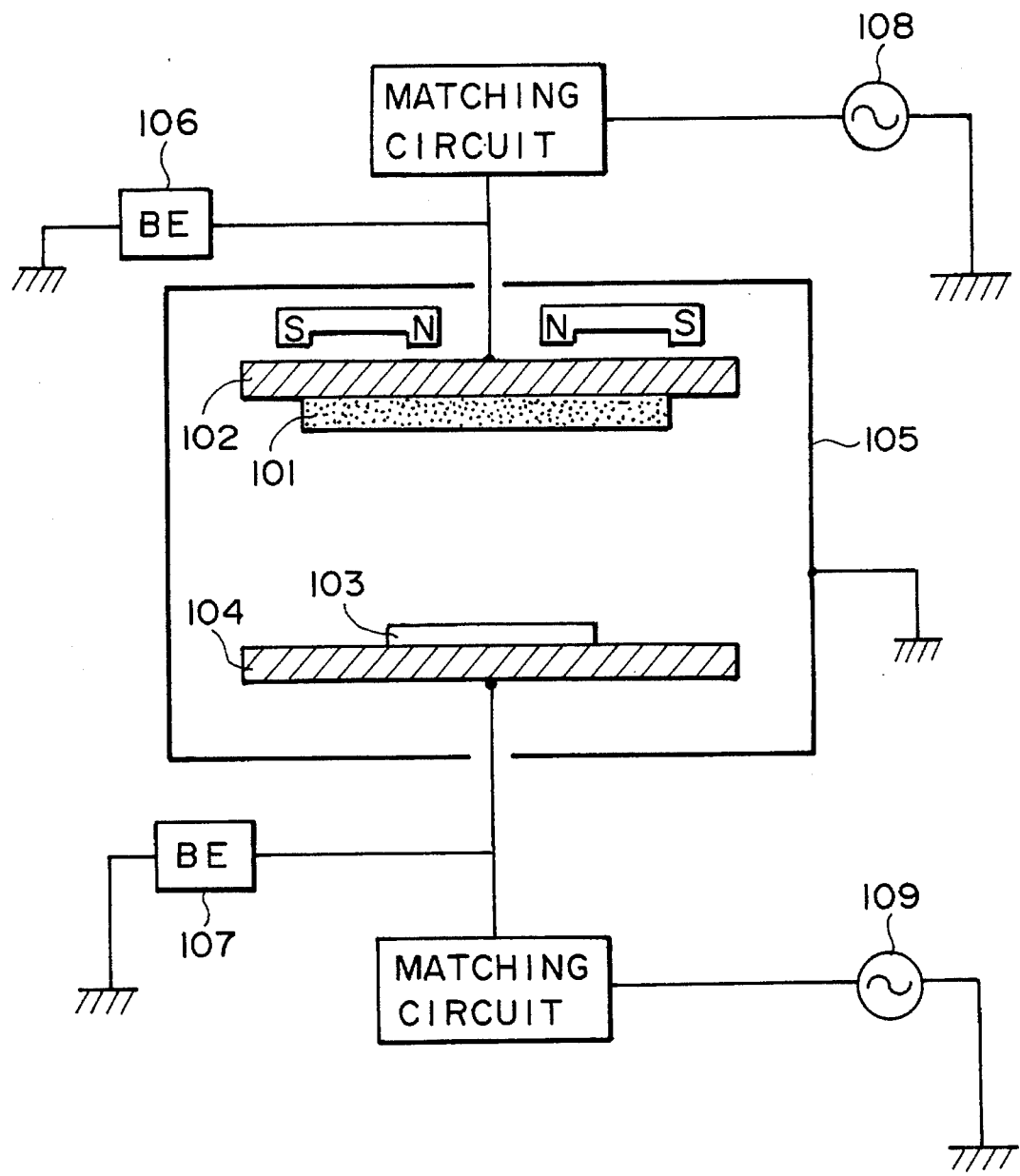
FIG. 2 is a schematic view showing an example of the bias sputtering apparatus of two frequency excitation.

The substrate surface cleaning in the case of the present invention when the substrate has an insulating material surface can be realized by use of the rf bias sputtering apparatus of two frequency excitation (see FIG. 2). The treatment method by use of this apparatus is described in detail below. After the deposition step of an amorphous semiconductor layer, solid phase growth is permitted to occur with the single crystal region as the seed crystal by application of heat treatment, whereby a single crystal thin film 4 of high quality can be grown on the amorphous insulating substrate (FIG. 1D). Because contaminants at the interface between the single crystal region and the amorphous semiconductor layer or on the amorphous insulating substrate have been removed, random nucleus generation within amorphous silicon and formation of unnecessary polycrystalline regions by growth of said random nucleus can be inhibited to increase the growth distance of the single crystal grown from the seed crystal. Whereby the crystallinity of the single crystal thin film formed is also of good quality.

The surface cleaning of the substrate by means of a bias sputtering apparatus of two frequency excitation and the deposition of amorphous silicon are described below.

In the space between the target holder 102 and the susceptor 104 shown in FIG. 2, a plasma of, for example, hydrogen, argon, xenon, neon or a gas mixture of these is formed by high frequency energy, and by controlling the energy power or frequency of high frequency applied to the substrate 103 or the impedance between the substrate 103 and the earth, ions are irradiated on the substrate with an energy smaller than the energy sputtered on the substrate 103, whereby the surface adherents primarily of water molecules can be removed without radiation damage or other damage to the substrate 103. More specifically, by controlling the high frequency supplied to the susceptor 104 mounted on the substrate 103 to a higher frequency and smaller power than the frequency applied to the target holder 102 for mounting the target 101, and by controlling the impedance between the susceptor 104 and the earth by use of the impedance control means 107 so that higher frequency energy controlled in power can be supplied to the susceptor 104, the self-bias of the substrate 103 having the insulating material surface is kept at a lower level. On the clean surface thus obtained, material for solid phase growth such as amorphous silicon, etc. is deposited by sputtering of the target 101. The sputtering phenomenon of target material is caused to occur by irradiating ions of argon, etc. having an energy of the difference between the plasma potential, and the target potential to the target 101 through self-bias by plasma or bias control by the direct current power source 106. Since this process can be performed continuously within the same apparatus, contaminants can be removed from between the substrate or the single crystal region and the amorphous silicon deposited, and the solid phase growth thereafter can be done smoothly. Also, impurity contamination during device preparation can be also removed.

In the cleaning step for making the surface of the substrate 103 a clean surface, it is desirable that the high frequency energy supplied from the power source 109 should be a frequency higher than the frequency of the high frequency energy supplied from the power source 108, and the high frequency energy supplied from the power source 109 should have a lower energy than the high frequency energy supplied from the power source 108 from the standpoints of control of the self-bias of the substrate 103 and control of energy of ions.

Here, the impedance control means 107 for controlling the self-bias of the substrate 103 may be preferably a band pass filter having a capacitor (C) and a coil (L), etc. The above impedance control means 107 can become desirably a minimum in impedance at the frequency of the high frequency energy supplied from the above-mentioned power source 108 for control of the self-bias of the substrate 103.

The above-mentioned direct current power source 106 may be also provided with a power source protection means such as a low pass filter, etc.

The frequency of the high frequency energy to be supplied to the above-mentioned susceptor 104 may be preferably 100 MHz or higher and 3 GHz or lower, more preferably 150 MHz or more and 1 GHz or lower.

On the other hand, the frequency of the high frequency energy to be supplied to the above-mentioned target holder should be made preferably 1 MHz or higher and 1 GHz or lower, more preferably 10 MHz or higher and 300 MHz or lower.

Here, the ratio of the frequencies of the high frequency energies to be supplied to the above-mentioned susceptor and the above-mentioned target holder should be preferably less than 1, more preferably 0.75 or lower.

The power of the high frequency energy to be supplied to the above-mentioned susceptor should be made preferably 0.01 W/cm² or higher and 1 W/cm² or lower, more preferably 0.05 W/cm² or higher and 0.5 W/cm² or lower.

As the method for forming a single crystal region (seed crystal) at the desired position on a substrate having an amorphous insulating surface which can be used in the present invention, there may be included, for example: (1) the method in which the single crystalline subbing material surface is covered with an amorphous insulating material having an opening at the desired position; (2) the method in which an energy beam such as a laser beam, etc. is irradiated to the desired position to effect melt recrystallization of the primary seed; (3) the method in which a sufficiently fine primary seed sufficient to form a single agglomerate by heat treatment at the desired position of an amorphous insulating substrate is arranged, and an agglomerate formed into a single crystal by heat treatment is formed (4) the method in which a primary seed is arranged at the desired position of an amorphous insulating substrate, and secondary nucleus growth (abnormal grain growth) is effected by heat treatment, etc.

The amorphous insulating substrate in the present invention may be one having an amorphous insulating material at least on the substrate surface. For example, a silicon wafer or a quartz glass with oxidized surface, a substrate having elements formed thereon which is covered with an amorphous insulating material such as $SiO_2$, $SiN$, etc. may be included as suitable examples.

Also, in the embodiments described above, silicon is mentioned as an example of the crystalline material for solid phase growth, but the crystalline material which can be formed by the process of the present invention is not limited only to silicon. Other crystalline materials which the present invention is applicable, to include, for example, Ge, Si—Ge, Si—C, Si—Ge—C, Si—Sn, Se, Se—Te, GaAs, etc.

EXAMPLE 1

In the following, Examples of the present invention are described in detail.

First, after an amorphous silicon film or a polysilicon film was deposited to a film thickness of 1000 Å on an amorphous $SiO_2$ substrate which is an amorphous insulating substrate by an LP-CVD apparatus, P was doped at a dose of $3.8 \times 10^{15}$ cm$^{-2}$, an acceleration voltage of 10 KeV to make the silicon thin film amorphous was applied. After resist patterning, the amorphous silicon was patterned by plasma etching to sizes of 1.2 μm square and the respective distances of 50 μm, and the amorphous silicon was formed into single crystal by abnormal grain growth by performing heat treatment: in an $N_2$ atmosphere at 1000° C. for 30 minutes to form a seed crystal. And, by use of the rf bias sputtering apparatus of two frequency excitation shown in FIG. 2, a high frequency energy of 190 MHz, 10 W was supplied to the substrate, and a high frequency energy of 100 MHz, 20 W to the target, and also a DC bias of −25 V applied to the target.

At this time, the inner pressure within the above-mentioned rf bias sputtering apparatus of two frequency excitation was maintained at 10 mTorr and the substrate temperature at 100° C. for 5 minutes, and the above substrate was subjected to cleaning with argon ions having an energy of 5 eV.

The surface adherents on the single crystal region comprising the seed crystal and the amorphous substrate were removed by Ar ions to have a clean surface exposed, and an amorphous silicon film was deposited to a film thickness of 2000 Å by sputtering of the target material within the same apparatus. No contaminant was adsorbed on the clean exposed surface.

The formation conditions of the amorphous silicon film were a high frequency energy of 190 MHz, 25 W supplied to the substrate, a high frequency energy of 100 MHz, 200 W supplied to the target, and a DC bias of −250 V applied to the target, an argon gas pressure of 10 mTorr, and a substrate temperature of 100° C.

Next, by performing heat treatment of 600° C., 50 hours in an $N_2$ atmosphere, solid phase growth with the single crystal region as the seed crystal was permitted to occur, thereby growing the single crystal thin film region of high quality over the whole surface on the amorphous insulating substrate (25 μm or more of the growth distance of L-SPE). In the above-described Example, the formation method of the portion which becomes the seed crystal of single crystal is not limited to the method shown above, but a fine single crystal region may be consequently formed.

Figure 3A:
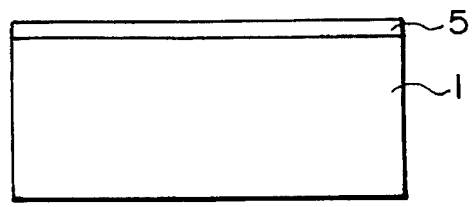
FIGS. 3A to 3C are diagrams for illustration of an example of the method for forming a fine single crystal region.
Figure 3B:
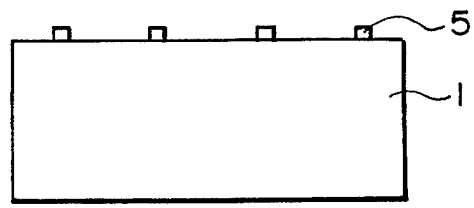
Figure 3C:
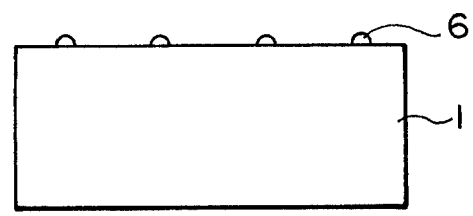

For example, as shown in FIG. 3, on the surface of the amorphous insulating substrate 1 constituting the deposition surface, after forming thinly an amorphous silicon film or a polysilicon film, P may be doped at a dose of $3.8 \times 10^{15}$ cm$^{-2}$ and an acceleration voltage of 10 KeV to make the silicon thin film amorphous (FIG. 3A), and after resist patterning, the amorphous silicon film 5 patterned to sizes of 0.9 μm square (FIG. 3B), followed by heat treatment in $H_2$ atmosphere at 950° C. for 3 minutes to make amorphous silicon single-crystallized. There is no problem at all by use of such method. At this time, an agglomeration reaction occurs, and the single crystalline seed 6 has no facet, but becomes a semispherical agglomerate (FIG. 3C).

Figure 4:
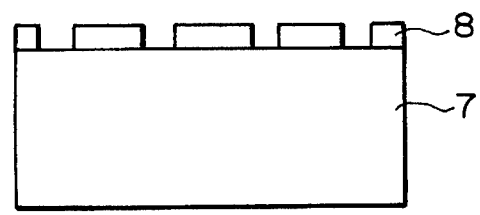
FIG. 4 is a diagram for illustration of an example in which the fine single crystal region is a substrate.

Also, as shown in FIG. 4, after formation of an insulating film such as oxidized film on a silicon wafer 7, patterning may be effected and a part of the silicon surface exposed to make a single crystalline seed crystal, but in this case, the silicon thin film formed has the drawback that it is not completely separated by insulation from the substrate.

EXAMPLE 2

Figure 5:
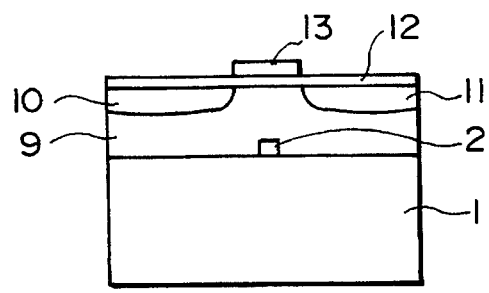
FIG. 5 is a schematic sectional view of the MOS type transistor by use of the semiconductor substrate of the present invention.

FIG. 5 is schematic sectional view of the MOS type transistor by use of the semiconductor thin film formed according to the above-described process for preparing the semiconductor film of the present invention. In the same Figure, 9 is a P-type semiconductor region. 10 and 11 are N-type semiconductor regions, forming respectively the source and the drain. 12 is a gate oxidized film formed on the P-type semiconductor region 9 and the N-type semiconductor regions 10 and 11, and 13 the gate electrode such as of polysilicon formed on the gate oxidized film 12. Because MOS type transistor prepared according to the present invention is formed on an insulating substrate, it has the advantage that there is no latch-up or α-ray disorder. Also, the channel mobility of the n-MOSFET thus obtained was found to be 550 cm²/V S as a maximum value (representative value 350 cm²/V S) at FET of a gate width=4 μm, effective channel length=2 μm, and the leak current during OFF equal or close to the value of bulk FET as on the order of $10^{-12}$.

As is apparent from the above description, the present invention has the following effects.

According to the process for forming the semiconductor thin film of the present invention, it has become possible to grow a single crystal thin film of high quality on an amorphous insulating substrate until it becomes a large region enough and necessary for preparation of a device, and the characteristics of MOSFET formed within the single crystal thin film were equal to those of the bulk substrate.

Further, due to the SOI structure, application to device such as high speed, high performance devices with little parasitic capacity with the substrate, typically three-dimensional integrated circuit, high performance solar battery on glass substrate, radiation resistant device, etc. has been rendered possible.

We claim:

1. A process for forming a semiconductor thin film on a substrate comprising sequentially the steps of:

(i) arranging seed crystals on said substrate surface;

(ii) mounting said substrate on which said seed crystals on a susceptor opposed to a target and provided in a chamber and supplying to said susceptor a high frequency energy having a frequency of 100 MHz to 3 GHz and supplying to the target holder a high frequency of 1 MHz to 1 GHz to generate ions between said substrate and said target holder;

(iii) irradiating the generated ions to thereby remove surface adherents on said substrate, wherein the irradiated ions have a lower energy than the sputtering threshold value of the substrate;

(iv) depositing an amorphous semiconductor film on said substrate from which said surface adherents have been continuously removed;

(v) performing heat treatment on said amorphous semiconductor film; and (vi) growing crystals by solid phase growth with said seed crystals as the origination points to form the semiconductor thin film.

2. A process according to claim 1, wherein the high frequency energy supplied to the susceptor is a high frequency energy with higher frequency than that of the high frequency energy supplied to the target holder.

3. A process according to claim 1, wherein the high frequency energy supplied to the susceptor is a high frequency energy with lower power than that of the high frequency energy supplied to the target holder.

4. A process according to claim 1, wherein said susceptor is earthed through an impedance control means.

5. A process according to claim 1, wherein a DC bias is further applied to said target holder.

6. A process according to claim 1, wherein said amorphous semiconductor film is formed by supplying high frequencies with different frequencies to the susceptor and the target holder.

7. A process according to claim 1, wherein the ions for removing said surface adherent are formed by a plasma of hydrogen, argon, xenon, neon or a gas mixture thereof.

* * * * *

UNITED STATES PATENT AND TRADEMARK OFFICE
CERTIFICATE OF CORRECTION

PATENT NO. : 5,484,746

DATED : January 16, 1996

INVENTOR(S) : Takeshi Ichikawa, et al.

It is certified that error appears in the above-identified patent and that said Letters Patent is hereby corrected as shown below:

COLUMN 1

Line 4, "continuation," should read --continuation--.
Line 12, "invention" should read --Invention--.
Line 26, "coefficient" should read --coefficients--.
Line 55, "Further" should read --Further,--
Line 55, "a" should read --the--.
Line 62, "A. Tambe," should read --A. Tamba,--.

COLUMN 2

Line 31, "form" should read --form a--.

COLUMN 3

Line 31, "depend" should be deleted.

COLUMN 4

Line 24, "potential," should read --potential--.
Line 25, "potential" should read --potential,--.

UNITED STATES PATENT AND TRADEMARK OFFICE
CERTIFICATE OF CORRECTION

PATENT NO. : 5,484,746

DATED : January 16, 1996

INVENTOR(S) : Takeshi Ichikawa, et al.

It is certified that error appears in the above-identified patent and that said Letters Patent is hereby corrected as shown below:

COLUMN 5

Line 18, "formed (4)" should read --formed; and (4)--.
    Line 35, "applicable, to" should read --applicable to,--.
    Line 52, "treatments:" should read --treatment--.

COLUMN 6

Line 36, "film such" should read --film 8 such--.

COLUMN 7

Line 3, "region enough and" should read --enough region--.
    Line 6, "device" should read --devices--.
    Line 16, "crystals" should read --crystals arranged on--.

UNITED STATES PATENT AND TRADEMARK OFFICE
CERTIFICATE OF CORRECTION

PATENT NO. : 5,484,746

DATED : January 16, 1996

INVENTOR(S) : Takeshi Ichikawa, et al.

It is certified that error appears in the above-identified patent and that said Letters Patent is hereby corrected as shown below:

COLUMN 8

Line 26, "adherent" should read --adherents--.

Signed and Sealed this

Second Day of July, 1996

Attest:

BRUCE LEHMAN

Attesting Officer

Commissioner of Patents and Trademarks